(12) United States Patent  (10) Patent No.: US 12,424,564 B2
Ting et al.  (45) Date of Patent: Sep. 23, 2025

(54) SEMICONDUCTOR DEVICE HAVING A SHIELDING LINE FOR SIGNAL CROSSTALK SUPPRESSION

(71) Applicant: NANYA TECHNOLOGY CORPORATION, New Taipei (TW)

(72) Inventors: Chen-Lun Ting, Taipei (TW); Tseng-Fu Lu, New Taipei (TW); Yung-Chih Yang, Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 124 days.

(21) Appl. No.: 17/679,302

(22) Filed: Feb. 24, 2022

(65) Prior Publication Data

US 2023/0268287 A1  Aug. 24, 2023

(51) Int. Cl.
 *H01L 23/528* (2006.01)
 *G11C 5/06* (2006.01)
 *H01L 23/552* (2006.01)
 *H10B 12/00* (2023.01)

(52) U.S. Cl.
 CPC ............ *H01L 23/552* (2013.01); *G11C 5/063* (2013.01); *H01L 23/5283* (2013.01); *H10B 12/482* (2023.02); *H10B 12/488* (2023.02)

(58) Field of Classification Search
 CPC .... H01L 23/552; H01L 23/5283; G11C 5/063
 See application file for complete search history.

(56) References Cited

U.S. PATENT DOCUMENTS

| | | | |
|---|---|---|---|
| 5,136,358 A | 8/1992 | Sakai et al. | |
| 7,923,809 B2 | 4/2011 | Onda et al. | |
| 10,088,950 B2 | 10/2018 | Hashimoto | |
| 2006/0166440 A1 | 7/2006 | Kaneoka et al. | |
| 2012/0104569 A1 | 5/2012 | Chen | |
| 2012/0155195 A1* | 6/2012 | Carlson | H01L 23/528 257/E21.602 |
| 2014/0017889 A1* | 1/2014 | Lee | H01L 21/3086 438/674 |
| 2014/0096101 A1 | 4/2014 | Kitaura | |
| 2014/0146507 A1* | 5/2014 | Lee | H01L 23/49827 174/257 |

(Continued)

FOREIGN PATENT DOCUMENTS

| | | |
|---|---|---|
| TW | 201912841 A | 4/2019 |
| TW | 201913762 A | 4/2019 |
| TW | 202002076 A | 1/2020 |

OTHER PUBLICATIONS

Merriam Webster OnLine Entry for Spacedly. No Date.*

(Continued)

*Primary Examiner* — Nathan W Ha
(74) *Attorney, Agent, or Firm* — Xuan Zhang

(57) ABSTRACT

A semiconductor device and a method of manufacturing a semiconductor device are provided. The semiconductor device includes a substrate having a surface, a first signal line disposed on the surface of the substrate, and a second signal line disposed on the surface of the substrate and spaced apart from the first signal line. The semiconductor device also includes a first shielding line between the first signal line and the second signal line. The minimum distance between the first signal line and the second signal line is equal to or less than about 90 nanometers (nm).

20 Claims, 16 Drawing Sheets

(56) References Cited

U.S. PATENT DOCUMENTS

| | | |
|---|---|---|
| 2015/0177310 A1 | 6/2015 | Roehner et al. |
| 2018/0174894 A1 | 6/2018 | Bouche et al. |
| 2020/0006082 A1 | 1/2020 | Su |
| 2021/0125836 A1 | 4/2021 | Huang et al. |
| 2021/0249416 A1 | 8/2021 | Li et al. |
| 2021/0272806 A1 | 9/2021 | Topaloglu et al. |
| 2023/0136674 A1 | 5/2023 | Chen et al. |

OTHER PUBLICATIONS

Oxford English Dictionary Entry for Spacedly. No Date.*
American Heritage Dictionary Entry for Spacedly. No Date.*
Office Action dated Jan. 7, 20232 related to Taiwanese Application No. 111121881.
Notice of Allowance dated Oct. 12, 2022 related to Taiwanese Application No. 111121879.
Summary translation of Notice of Allowance dated Oct. 12, 2022 related to Taiwanese Application No. 111121879.
Office Action and and the search report mailed on Mar. 17, 2025 related to U.S. Appl. No. 17/679,482.
Office Action and and the search report mailed on May 6, 2025 related to U.S. Appl. No. 17/679,482.
Office Action and and the search report mailed on Aug. 14, 2024 related to U.S. Appl. No. 17/679,482.

* cited by examiner

SEMICONDUCTOR DEVICE HAVING A SHIELDING LINE FOR SIGNAL CROSSTALK SUPPRESSION

TECHNICAL FIELD

The present disclosure relates to a semiconductor device, and more particularly, to a semiconductor device having a shielding line for signal crosstalk suppression.

DISCUSSION OF THE BACKGROUND

Typical memory devices (such as dynamic random access memory (DRAM) devices) include signal lines, such as word lines and bit lines crossing the word lines.

As DRAM devices are scaled down and the dimensions and/or pitches of the signal lines are getting smaller, capacitive coupling, and/or inductive magnetic coupling become significant. Electromagnetic noise or crosstalk between the signal lines may become severe, thereby diminishing device performance.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device. The semiconductor device includes a substrate having a surface, a first signal line disposed on the surface of the substrate, and a second signal line disposed on the surface of the substrate and spaced apart from the first signal line. The semiconductor device also includes a first shielding line between the first signal line and the second signal line. The minimum distance between the first signal line and the second signal line is equal to or less than about 90 nanometers (nm).

Another aspect of the present disclosure provides a semiconductor device. The semiconductor device includes a substrate having a surface, a first signal line disposed on the surface of the substrate, and a second signal line disposed on the surface of the substrate and spaced apart from the first signal line. The semiconductor device also includes a first shielding line between the first signal line and the second signal line. The minimum distance between the first signal line and the first shielding line is equal to or less than about 40 nm.

Another aspect of the present disclosure provides a method of manufacturing a semiconductor device. The method includes disposing a mandrel layer on a dielectric layer and patterning the mandrel layer to form a first mandrel and a second mandrel spaced apart from the first mandrel. The minimum distance between the first mandrel and the second mandrel is equal to or less than about 90 nm. The method also includes forming a first spacer adjacent to a first side of the first mandrel, a second spacer adjacent to a second side of the first mandrel, a third spacer adjacent to a first side of the second mandrel, and a fourth spacer adjacent to a second side of the second mandrel. The method also includes etching the dielectric layer by using the first spacer, the second spacer, the third spacer, and the fourth spacer as etching masks to form a first dielectric element, a second dielectric element, a third dielectric element, and a fourth dielectric element. The method also includes forming a first shielding line between the second dielectric element and the third dielectric element.

By forming a dummy line between two signal lines (such as an aggressor line and a victim line) and connecting the dummy line to power or ground, electromagnetic noise or crosstalk between the signal lines may be reduced or prevented.

In addition, the dummy line and the signal lines can be formed by a pitch multiplication process, such as a self-aligned pitch doubling technique or a self-aligned double patterning technique. In comparison with conventional lithographic techniques, the manufacturing process of the present disclosure overcomes lithography issues related to scaling and creates a denser memory array. Therefore, the device performance can be enhanced.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1A:
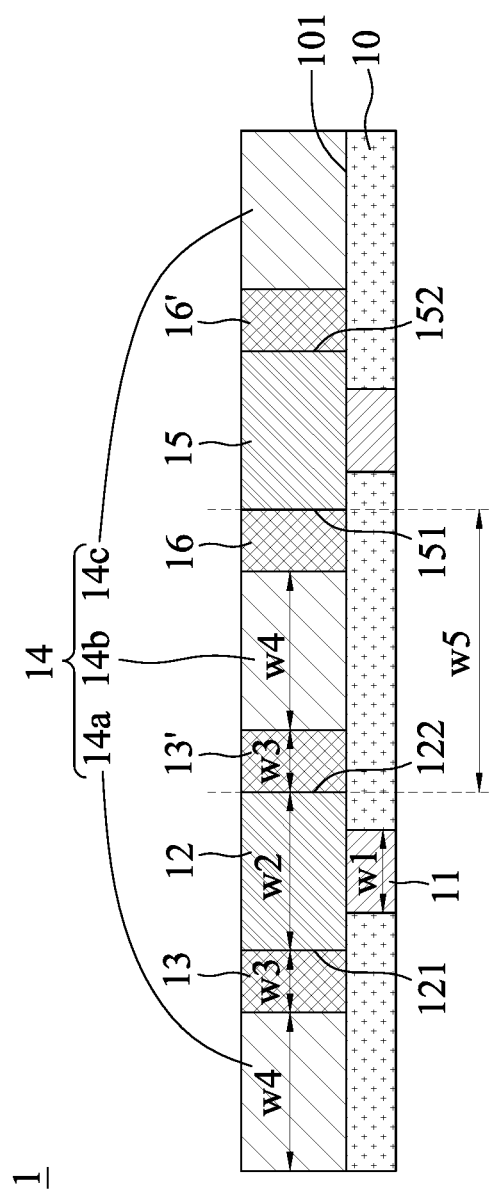
FIG. 1A is a schematic cross-sectional view of a semiconductor device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 illustrates a cross-sectional view of a semiconductor device 1 in accordance with some embodiments of the present disclosure. In some embodiments, the semiconductor device 1 may include a circuit, such as a memory cell. In some embodiments, the memory cell may include a dynamic random access memory cell (DRAM cell).

In addition, the semiconductor device 1 may be or include a portion of an integrated circuit (IC) chip that includes various passive and active microelectronic devices, such as resistors, capacitors, inductors, diodes, p-type field-effect transistors (pFETs), n-type field-effect transistors (nFETs), metal-oxide semiconductor field-effect transistors (MOSFETs), complementary metal-oxide semiconductor (CMOS) transistors, bipolar junction transistors (BJTs), laterally-diffused MOS (LDMOS) transistors, high-voltage transistors, high-frequency transistors, fin field-effect transistors (FinFETs), other suitable IC components, or combinations thereof.

As shown in FIG. 1, in some embodiments, the semiconductor device 1 may include a substrate 10, a conductive element 11, signal lines 12,15, dielectric elements 13, 13', 16, 16', and shielding lines 14a, 14b, and 14c.

In some embodiments, the substrate 10 may include, for example, silicon (Si), germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials. In some other embodiments, the substrate 10 may include a semiconductor-on-insulator substrate, such as a silicon-on-insulator (SOI) substrate, a silicon germanium-on-insulator (SGOI) substrate, or a germanium-on-insulator (GOI) substrate.

Depending on the IC fabrication stage, the substrate 10 may include various material layers (e.g., dielectric layers, semiconductor layers, and/or conductive layers) configured to form IC features (e.g., doped regions, isolation features, gate features, source/drain features, interconnect features, other features, or combinations thereof).

For example, the conductive element 11 may be disposed in the substrate 10. The conductive element 11 may be formed from doped regions of a bulk semiconductor substrate, or from epitaxial layers. The conductive element 11 may be electrically connected to, for example, a terminal of a MOSFET (such as a gate, a source, or a drain), a terminal of a BJT (such as an emitter, a collector, or a base), or other IC features in the semiconductor device 1 (such as the DRAM cell).

The conductive element 11 may be at least partially exposed from the substrate 10. The signal line 12 and signal line 15 may be electrically connected to the one or more conductive elements 11 to control the operations of the semiconductor device 1 (such as the DRAM cell).

In some embodiments, the operations of the semiconductor device 1 may include a change in state from a binary one to a binary zero or vice-versa. For example, a change in state may involve an accumulation and/or storage of charge or a release of stored charge.

In some embodiments, the conductive element 11 may include, for example, polysilicon (poly-Si), metals (such as aluminum (Al), magnesium (Mg), tungsten (W), lanthanum (La), etc.), or metal alloys. In some embodiments, the conductive element 11 may include, for example, titanium-based materials (such as titanium nitride (TiN) or titanium aluminum nitride (TiAlN)), tantalum-based materials (such as tantalum nitride (TaN), tantalum aluminum nitride (TaAlN), or tantalum carbide ($Ta_2C$), or silicide (such as PtSi, $TiSi_2$, CoSi, NiSi, $MoSi_2$, TaSi, $WSi_2$, etc.).

While two conductive elements are illustrated in the figures, it will be appreciated that the semiconductor device 1 may include any suitable number of conductive elements.

The signal line 12 may be disposed on a surface 101 of the substrate 10. The signal line 12 may be electrically connected to the conductive element 11. A width "w2" of the signal line 12 is measured in a direction substantially parallel to the surface 101 of the substrate 10. The width w2 may be equal to or less than about 20 nanometers (nm). In some embodiments, the width w2 may be greater than a width "w1" of the conductive element 11 measured in a direction substantially parallel to the surface 101 of the substrate 10. However, in some other embodiments, the width w2 may be equal to or less than the width w1.

The signal line 15 may be disposed on the surface 101 of the substrate 10 and spaced apart from the signal line 12. The signal line 15 may be electrically connected to a conductive element in the substrate 10. The signal line 15 may have a width substantially equal to the width w2 of the signal line 12.

The signal line 12 and the signal line 15 may each be a part of word lines and bit lines of the semiconductor device 1. The signal line 12 and the signal line 15 may each include, for example, polysilicon (poly-Si), metals (such as aluminum (Al), magnesium (Mg), tungsten (W), lanthanum (La), etc.), or metal alloys.

While two signal lines are illustrated in the figures, it will be appreciated that the semiconductor device 1 may include any suitable number of signal lines.

The signal line 12 may have a side 121 and a side 122 opposite to the side 121. The side 121 and the side 122 may each be substantially perpendicular to the surface 101 of the substrate 10. The signal line 15 may have a side 151 and a side 152 opposite to the side 151. The side 151 and the side 152 may each be substantially perpendicular to the surface 101 of the substrate 10.

In some embodiments, the minimum distance "w5" between the signal line 12 and the signal line 15 is measured in a direction substantially parallel to the surface 101 of the substrate 10. For example, the minimum distance w5 may be measured between the side 122 of the signal line 12 and the side 151 of the signal line 15. The minimum distance w5 may be equal to or less than about 90 nm.

The dielectric element 13 may contact, cover, seal, or encapsulate the side 121 of the signal line 12. The dielectric element 13' may contact, cover, seal, or encapsulate the side 122 of the signal line 12. The dielectric element 16 may contact, cover, seal, or encapsulate the side 151 of the signal line 15. The dielectric element 16' may contact, cover, seal, or encapsulate the side 152 of the signal line 15.

In some embodiments, the dielectric element 13, the dielectric element 13', the dielectric element 16, and the dielectric element 16' may each be a spacer. In some embodiments, the dielectric element 13, the dielectric element 13', the dielectric element 16, and the dielectric element 16' may each include, for example, nitride, oxide, oxynitride amorphous silicon, polycrystalline silicon, or another material suitable for use in the required patterning operation as shown in FIG. 4H. Exemplary spacer materials may include, but are not limited to, hafnium silicate (HfSiO$_x$), hafnium oxide (HfO$_2$), zirconium silicate (ZrSiO$_x$), zirconium oxide (ZrO$_2$), silicon nitride (Si$_3$N$_4$), silicon oxynitride (SiON), or silicon oxide (SiO$_2$), tetraethylorthosilicate (TEOS), carbon-doped silicon, etc.

In some embodiments, the dielectric element 13, the dielectric element 13', the dielectric element 16, and the dielectric element 16' may each be a single-layer structure.

A width "w3" of each of the dielectric element 13, the dielectric element 13', the dielectric element 16, and the dielectric element 16' is measured in a direction substantially parallel to the surface 101 of the substrate 10. The width w3 may be equal to or less than about 40 nm. For example, the width w3 may be between about 10 nm and about 40 nm. In some embodiments, the dielectric element 13, the dielectric element 13', the dielectric element 16, and the dielectric element 16' may have the same width.

The shielding line 14a, the shielding line 14b, and shielding line 14c may each be disposed on the surface 101 of the substrate 10. The shielding line 14a, the shielding line 14b, and shielding line 14c may be parts of a shielding structure 14. The shielding line 14a, the shielding line 14b, and shielding line 14c may be electrically connected to one another. The shielding line 14a, the shielding line 14b, and shielding line 14c may be electrically connected to power or ground.

The shielding line 14a and the shielding line 14b may be disposed on opposite sides of the signal line 12. The signal line 12 may be between the shielding line 14a and the shielding line 14b. The shielding line 14b may be between the signal line 12 and the signal line 15. The shielding line 14b and the shielding line 14c may be disposed on opposite sides of the signal line 15. The signal line 15 may be between the shielding line 14b and the shielding line 14c.

The shielding line 14a, the shielding line 14b, and shielding line 14c may each be referred to as a dummy line.

The shielding line 14a, the shielding line 14b, and shielding line 14c may not be utilized to form electrically conductive interconnects to the conductive element 11. By contrast, the signal line 12 and signal line 15 may be positioned above the conductive element 11 and may be utilized to form electrically conductive interconnects to the conductive element 11.

The shielding line 14a, the shielding line 14b, and shielding line 14c may be configured to provide an electromagnetic interference (EMI) shielding protection for the signal line 12 and signal line 15. For example, the shielding line 14a, the shielding line 14b, and shielding line 14c may be configured to provide an EMI shielding to prevent the signal line 12 from being interfered with by the signal line 15, and vice versa.

The shielding line 14a, the shielding line 14b, and shielding line 14c may each include, for example, polysilicon (poly-Si), metals (such as aluminum (Al), magnesium (Mg), tungsten (W), lanthanum (La), etc.), or metal alloys. The shielding line 14a, the shielding line 14b, and shielding line 14c may have the same material. The shielding line 14a, the shielding line 14b, and shielding line 14c may have the same material as the signal line 12 and signal line 15. In some embodiments, the shielding line 14a, the shielding line 14b, and shielding line 14c may be formed in the same operation as the signal line 12 and signal line 15.

The width w3 of the dielectric element 13 may be the minimum distance between the shielding line 14a and the signal line 12. The width w3 of the dielectric element 13' may be the minimum distance between the shielding line 14b and the signal line 12. The width w3 of the dielectric element 16 may be the minimum distance between the shielding line 14b and the signal line 15. The width w3 of the dielectric element 16' may be the minimum distance between the shielding line 14c and the signal line 15.

A width "w4" of each of the shielding line 14a, the shielding line 14b, and shielding line 14c is measured in a direction substantially parallel to the surface 101 of the substrate 10. The width w4 may be equal to or less than about 70 nm. For example, the width w4 may be between about 10 nm and about 70 nm. In some embodiments, the width w4 may be the minimum width of each of the shielding line 14a, the shielding line 14b, and shielding line 14c. In some embodiments, the width w4 may be defined by a pitch multiplication process, such as a self-aligned pitch doubling technique or a self-aligned double patterning technique. In some embodiments, the width w4 may be greater than the width w3.

In some embodiments, the minimum distance w5 between the signal line 12 and the signal line 15 may be the sum of the width w4 of the shielding line 14b, the width w3 of the dielectric element 13', and the width w3 of the dielectric element 16.

As described, the width w3 may be between about 10 nm and about 40 nm and the width w4 may be between about 10 nm and about 70 nm. However, the minimum distance w5 between the signal line 12 and the signal line 15 is kept equal to or less than about 90 nm.

As DRAM devices (such as the semiconductor device 1) are scaled down and the dimensions and/or pitches of the signal lines are getting smaller, capacitive coupling, and/or inductive magnetic coupling become significant. Electromagnetic noise or crosstalk between the signal lines may become severe, thereby diminishing device performance.

According to some embodiments of the present disclosure, by forming a dummy line between two signal lines (such as an aggressor line and a victim line) and connecting the dummy line to power or ground, electromagnetic noise or crosstalk between the signal lines may be reduced or prevented.

In addition, the dummy line and the signal lines can be formed by a pitch multiplication process, such as a self-aligned pitch doubling technique or a self-aligned double patterning technique. In comparison with conventional lithographic techniques, the manufacturing process of the present disclosure overcomes lithography issues related to scaling and creates a denser memory array. Therefore, the device performance can be enhanced.

Figure 1B:
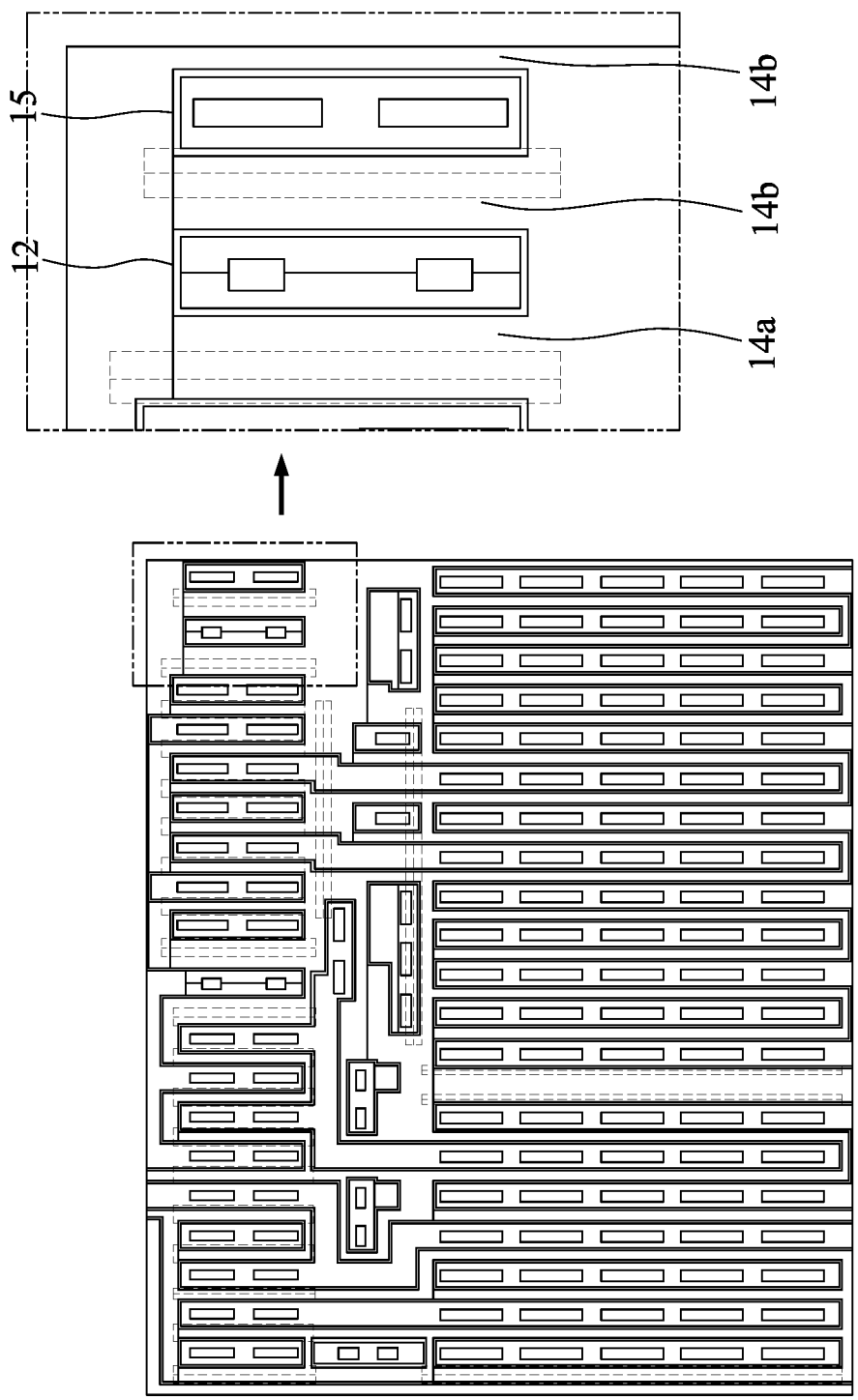
FIG. 1B is a schematic top view of a semiconductor device in accordance with some embodiments of the present disclosure.

FIG. 1B is a schematic top view of a semiconductor device in accordance with some embodiments of the present disclosure. In some embodiments, a cross-sectional view as shown in FIG. 1A (or a cross-sectional view as shown in FIG. 2, or a cross-sectional view as shown in FIG. 3) may be a cross-sectional view of a part of the semiconductor device shown in FIG. 1B.

For example, the semiconductor device 1 shown in FIG. 1A may have a top view highlighted with the dotted box. For example, the semiconductor device 1 shown in FIG. 1A may be formed on a periphery of a memory array. In some embodiments, the density of the circuitry on the periphery may be less than the density of the memory array (e.g., the tight-pitch regions). For example, the minimum distance between the signal line 12 and the signal line 15 may be greater than the minimum distance between two lines in the memory array.

Figure 2:
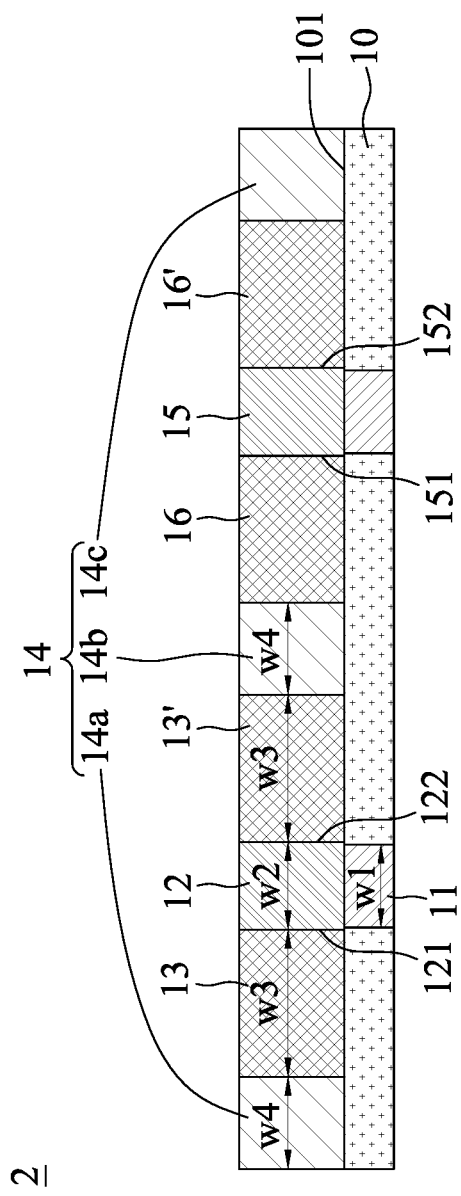
FIG. 2 is a schematic cross-sectional view of a semiconductor device in accordance with some embodiments of the present disclosure.
Figure 3:
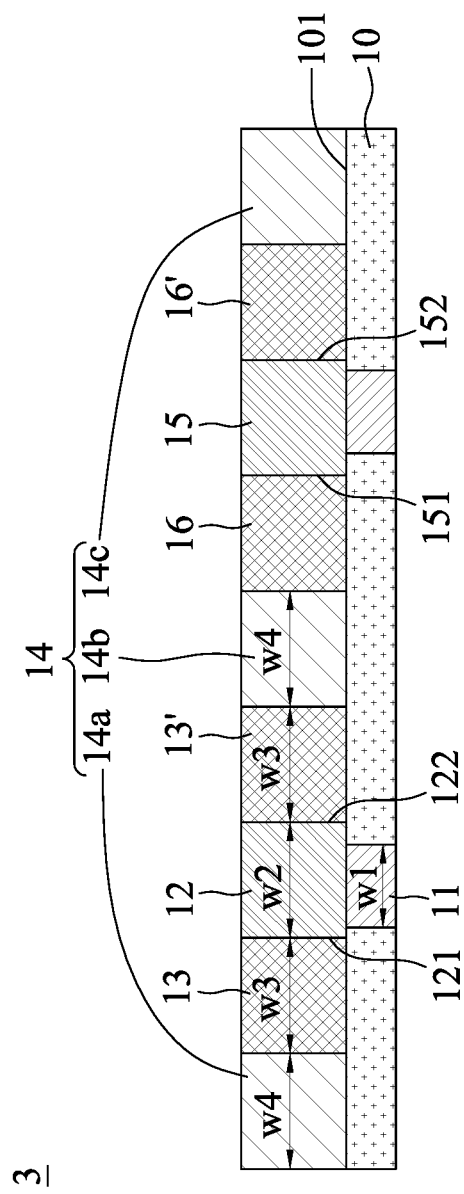
FIG. 3 is a schematic cross-sectional view of a semiconductor device in accordance with some embodiments of the present disclosure.

In some embodiments, the cross-sectional view as shown in FIG. 1A (or a cross-sectional view as shown in FIG. 2, or a cross-sectional view as shown in FIG. 3) may be in two directions, an "X" direction (corresponding to an orientation along which word lines are elongated) and a "Y" direction (corresponding to an orientation along which bit lines are elongated). In some embodiments, the word line direction may be substantially orthogonal to the bit line direction. In some other embodiments, the word line direction may not be orthogonal to the bit line direction.

In some embodiments, the signal lines of the semiconductor device 1 (such as the signal line 12 and the signal line 15) may be parallel. In some embodiments, the shielding lines of the semiconductor device 1 (such as the shielding line 14a, the shielding line 14b, and shielding line 14c) may be parallel. In some embodiments, the signal lines and the shielding lines of the semiconductor device 1 may be parallel.

FIG. 2 is a schematic cross-sectional view of a semiconductor device 2 in accordance with some embodiments of the present disclosure. The semiconductor device 2 of FIG. 2 is similar to the semiconductor device 1 of FIG. 1A, except for the differences described below.

In FIG. 2, the width w3 of each of the dielectric element 13, the dielectric element 13', the dielectric element 16, and the dielectric element 16' may be greater than the width w4 of each of the shielding line 14a, the shielding line 14b, and shielding line 14c.

FIG. 3 is a schematic cross-sectional view of a semiconductor device 3 in accordance with some embodiments of the present disclosure. The semiconductor device 3 of FIG. 3 is similar to the semiconductor device 1 of FIG. 1A, except for the differences described below.

In FIG. 3, the width w3 of each of the dielectric element 13, the dielectric element 13', the dielectric element 16, and the dielectric element 16' may be substantially equal to the width w4 of each of the shielding line 14a, the shielding line 14b, and shielding line 14c.

FIGS. 4A, 4B, 4C, 4D, 4E, 4F, 4G, 4H, 4I, 4J, and 4K illustrate stages of a method of manufacturing a semiconductor device in accordance with some embodiments of the present disclosure. At least some of these figures have been simplified for a better understanding of the aspects of the present disclosure. In some embodiments, the semiconductor device 1 in FIG. 1A, the semiconductor device 2 in FIG. 2, and the semiconductor device 3 in FIG. 3 may be manufactured by the operations described below with respect to FIGS. 4A, 4B, 4C, 4D, 4E, 4F, 4G, 4H, 4I, 4J, and 4K.

Figure 4A:
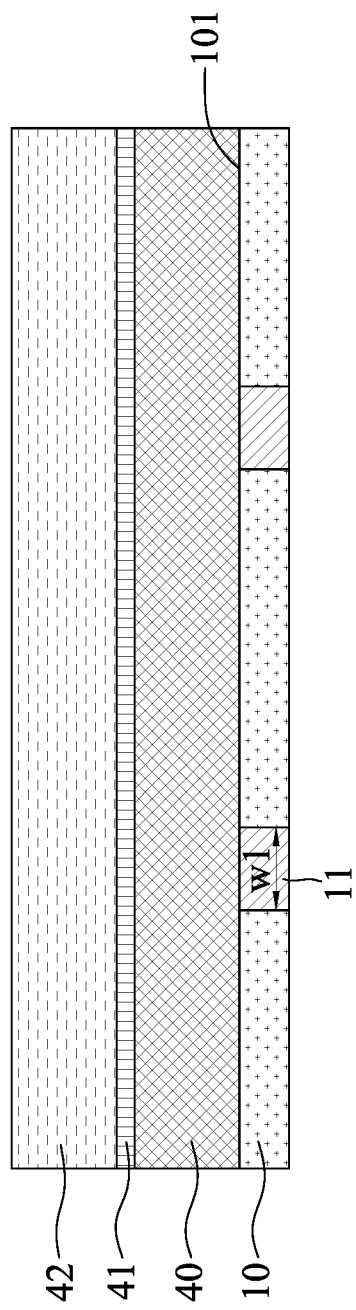
FIG. 4A illustrates one or more stages of a method of manufacturing a semiconductor device in accordance with some embodiments of the present disclosure.

Referring to FIG. 4A, the substrate 10 is provided. One or more conductive elements 11 may be formed in the substrate 10. The conductive elements 11 may be formed from doped regions of a bulk semiconductor substrate, or from epitaxial layers. The conductive elements 11 may be at least partially exposed from the substrate 10.

In some embodiments, shallow trench isolation (STI) regions (not shown in the figures) may be formed within the substrate 10 using, for example, lithographic, etch, deposition, and chemical mechanical planarization (CMP) processes, to electrically isolate the subsequently formed signal lines.

A dielectric layer 40 may be disposed on the surface 101 of substrate 10. In some embodiments, the dielectric layer 40 may be blanket-disposed on the surface 101 of substrate 10. In some embodiments, the dielectric layer 40 may be formed by a thermal oxidation operation, a chemical vapor deposition (CVD) operation, a low-pressure chemical vapor deposition (LPCVD) operation, a plasma enhanced chemical vapor deposition (PECVD) operation, other feasible operations, or a combination thereof. The dielectric layer 40 may include a material as listed above for the dielectric element 13, the dielectric element 13', the dielectric element 16, and the dielectric element 16' in FIG. 1A.

A mandrel layer 42 may be disposed on the dielectric layer 40.

The mandrel layer 42 may be blanket-disposed on the dielectric layer 40. In some embodiments, the mandrel layer 42 may be formed by a thermal oxidation operation, a CVD operation, an LPCVD operation, a PECVD operation, other feasible operations, or a combination thereof. The mandrel layer 42 may include, for example, nitride, oxide, oxynitride amorphous silicon, polycrystalline silicon, or another material suitable for use in the required patterning operation as shown in FIG. FIG. 4C.

In some embodiments, an etch stop layer 41 may be formed over the dielectric layer 40 prior to forming the mandrel layer 42. In some other embodiments, the etch stop layer 41 may be omitted. The etch stop layer 41 is not illustrated in the following operations for conciseness.

Figure 4B:
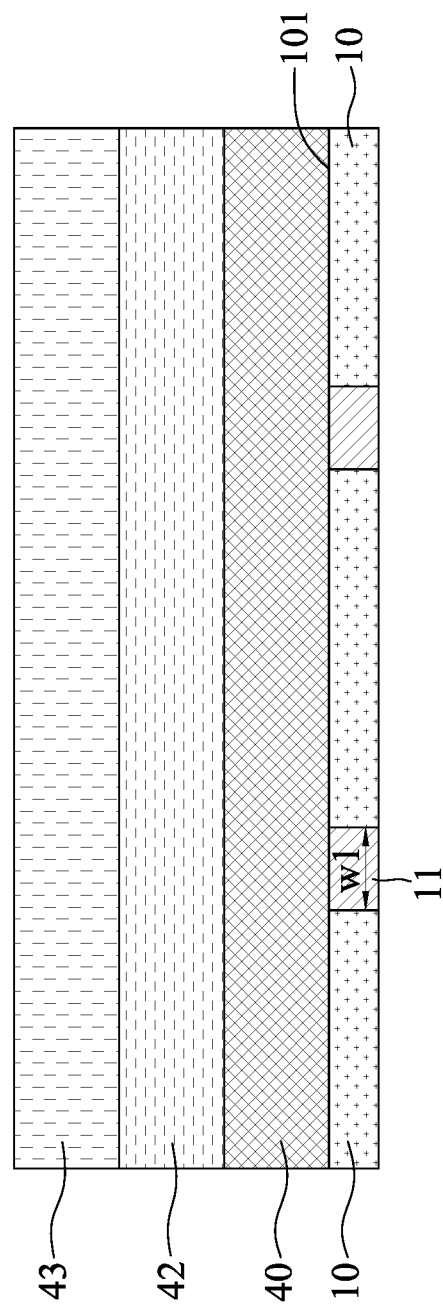
FIG. 4B illustrates one or more stages of a method of manufacturing a semiconductor device in accordance with some embodiments of the present disclosure.

Referring to FIG. 4B, a mask layer 43 may be disposed on the mandrel layer 42. The mask layer 43 may include, for example, nitride, oxide, oxynitride amorphous silicon, polycrystalline silicon, or another material suitable for use in the required patterning operation as shown in FIG. FIG. 4C. In some embodiments, the mask layer 43 may be formed through, for example, a CVD operation, an LPCVD operation, a PECVD operation, other feasible operations, or a combination thereof.

In some embodiments, a photoresist (not shown) and another sacrificial mask material, such as anti-reflective coating (ARC) material, may be deposited on the mask layer 43.

Figure 4C:
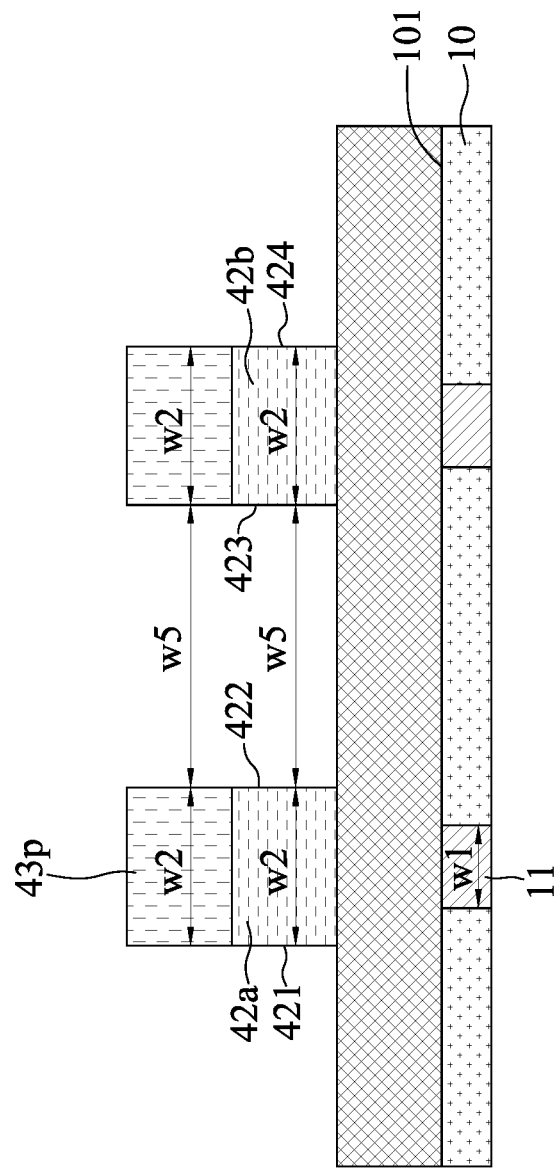
FIG. 4C illustrates one or more stages of a method of manufacturing a semiconductor device in accordance with some embodiments of the present disclosure.

Referring to FIG. 4C, the mask layer 43 may be patterned using photolithography and etching processes, to form a mask pattern 43*p*. The mandrel layer 42 may be patterned by etching using the mask pattern 43*p* as an etch mask. As a result, the mandrels 42*a* and 42*b* may be formed.

In some embodiments, the mask layer 43 and the mandrel layer 42 may be anisotropically etched. In some embodiments, the mask layer 43 and the mandrel layer 42 may be etched in the same operation. In some embodiments, the mask layer 43 and the mandrel layer 42 may be etched in different operations. For example, the mask layer 43 and the mandrel layer 42 may be etched by using, for example, reactive ion etching (RIE) with different chemistry.

The mandrel 42*a* and the mandrel 42*b* may have the width w2 described with respect to FIG. 1A. The width w2 may be equal to or less than about 20 nm. The mandrel 42*a* and the mandrel 42*b* may be spaced apart from each other by the minimum distance w5 described with respect to FIG. 1A. The minimum distance w5 may be equal to or less than about 90 nm.

The mandrel 42*a* may have a side 421 and a side 422 opposite to the side 421. The mandrel 42*b* may have a side 423 and a side 424 opposite to the side 423.

Figure 4D:
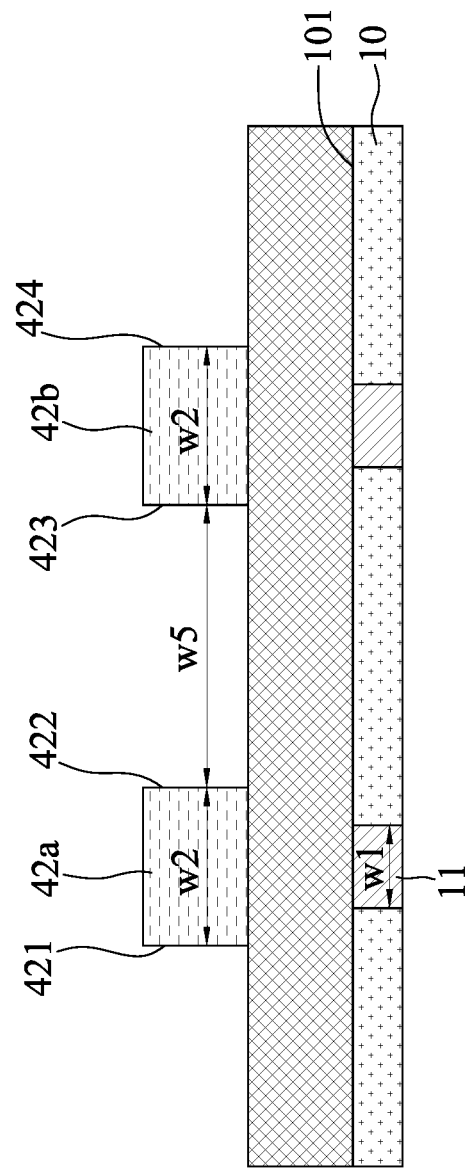
FIG. 4D illustrates one or more stages of a method of manufacturing a semiconductor device in accordance with some embodiments of the present disclosure.

Referring to FIG. 4D, the mask pattern 43*p* may be removed from the mandrel 42*a* and the mandrel 42*b* by, for example, an etching process.

Figure 4E:
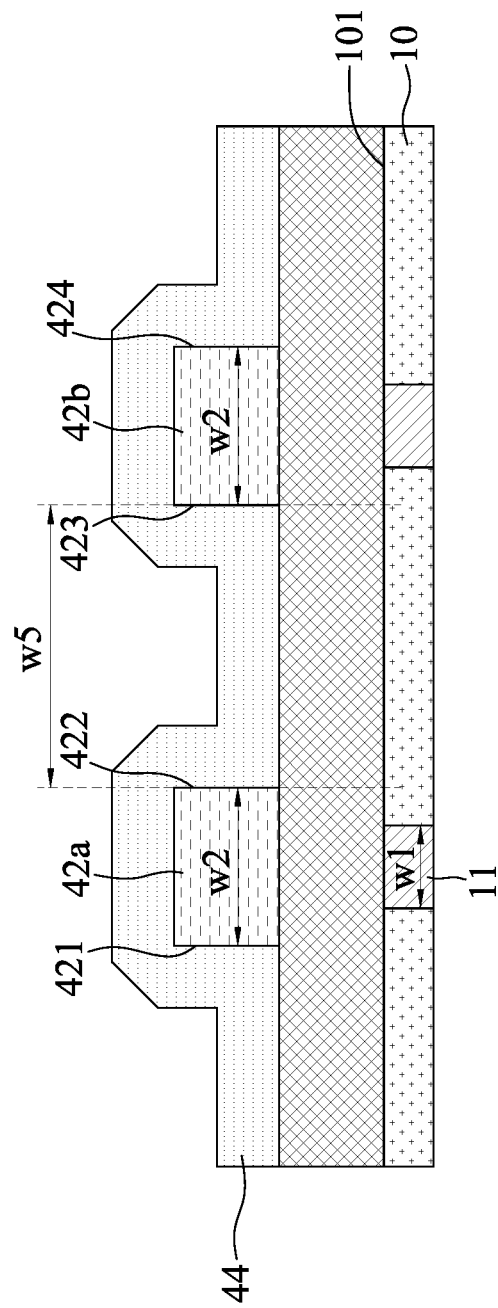
FIG. 4E illustrates one or more stages of a method of manufacturing a semiconductor device in accordance with some embodiments of the present disclosure.

Referring to FIG. 4E, a conformal spacer layer 44 may be disposed on the dielectric layer 40 to cover the mandrel 42*a* and the mandrel 42*b*. The conformal spacer layer 44 may be formed of silicon nitride, silicon oxide, silicon oxynitride, or any type of organic or inorganic material having etch selectivity with respect to the mandrel 42*a* and the mandrel 42*b*. The conformal spacer layer 44 may be formed through, for example, an atomic layer deposition (ALD) operation, a CVD operation, an LPCVD operation, a PECVD operation, other feasible operations, or a combination thereof.

Figure 4F:
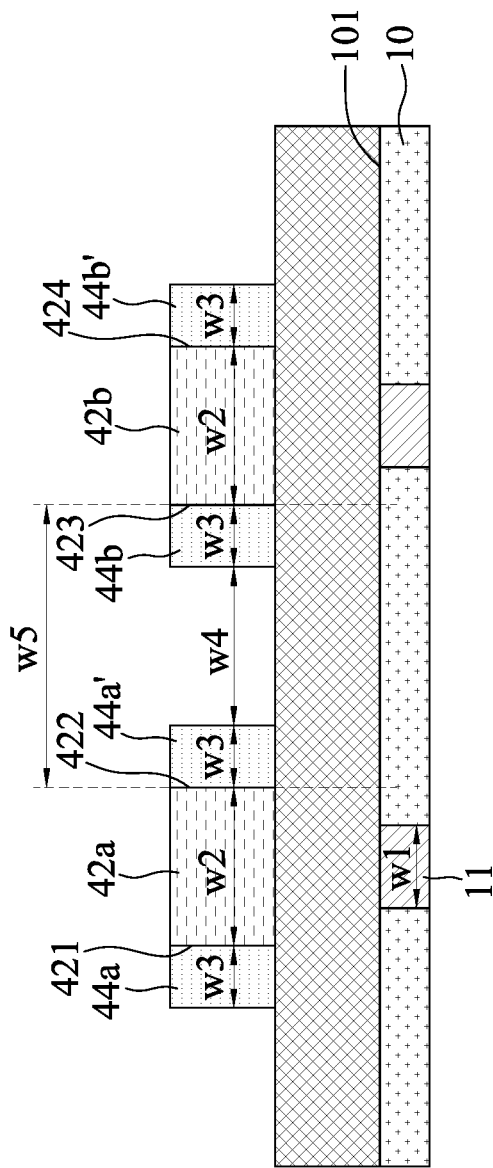
FIG. 4F illustrates one or more stages of a method of manufacturing a semiconductor device in accordance with some embodiments of the present disclosure.

Referring to FIG. 4F, the conformal spacer layer 44 may be partially removed to form a spacer 44*a* adjacent to the side 421 of the mandrel 42*a*, a spacer 44*a*' adjacent to the side 422 of the mandrel 42*a*, a spacer 44*b* adjacent to the side 423 of the mandrel 42*b*, and a spacer 44*b*' adjacent to the side 424 of the mandrel 42*b*. For example, the conformal spacer layer 44 may be etched by using an RIE operation with chemistries based upon $CHF_3$ or $CF_4$ to etch silicon oxide or silicon oxynitride, or upon $CHF_3/O_2$ to etch silicon nitride.

The spacer 44*a*, the spacer 44*a*', the spacer 44*b*, and the spacer 44*b*' are each formed with the width w3 described with respect to FIG. 1A. The width w3 may be equal to or less than about 40 nm. For example, the width w3 may be between about 10 nm and about 40 nm.

Since the minimum distance w5 between the signal line 12 and the signal line 15 is kept equal to or less than about 90 nm, the width w4 may be between about 10 nm and about 70 nm.

Figure 4G:
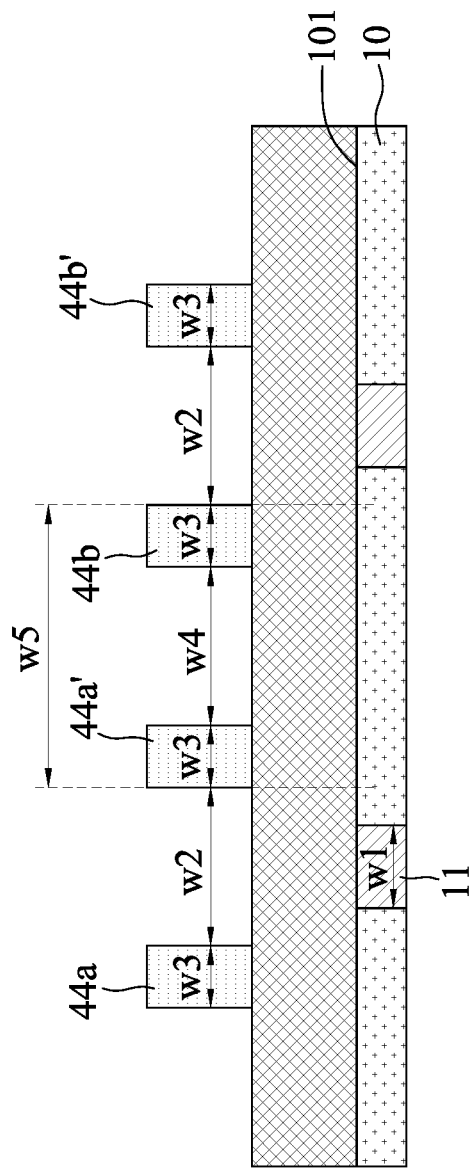
FIG. 4G illustrates one or more stages of a method of manufacturing a semiconductor device in accordance with some embodiments of the present disclosure.
Figure 4H:
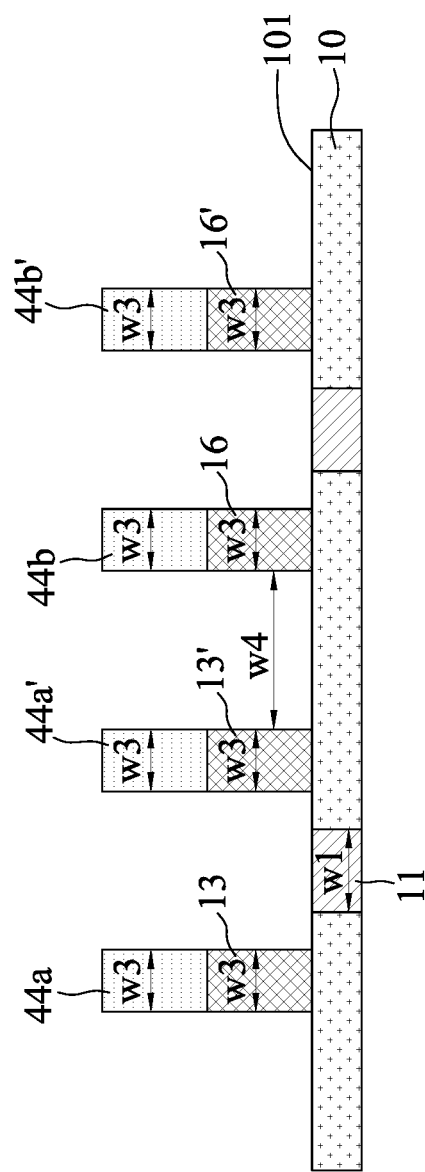
FIG. 4H illustrates one or more stages of a method of manufacturing a semiconductor device in accordance with some embodiments of the present disclosure.

Referring to FIG. 4G, the mandrel 42*a* and the mandrel 42*b* may be removed from the dielectric layer 40, leaving the spacer 44*a*, the spacer 44*a*', the spacer 44*b*, and the spacer 44*b*' on the dielectric layer 40. For example, the mandrel 42*a* and the mandrel 42*b* may be etched by using an RIE operation.

Removal of the mandrel 42*a* and the mandrel 42*b* results in the formation of a gap between the spacer 44*a* and the spacer 44*a*' and a gap between the spacer 44*b* and the spacer 44*b*'. The widths w2 of the mandrel 42*a* and the mandrel 42*b* may be controlled to determine the widths w2 of the gaps.

Referring to FIG. 4H, the dielectric layer 40 may be patterned by etching using the spacer 44*a*, the spacer 44*a*', the spacer 44*b*, and the spacer 44*b*' as etch masks. As a result, the dielectric element 13, the dielectric element 13', the dielectric element 16, and the dielectric element 16' may be formed.

The dielectric element 13, the dielectric element 13', the dielectric element 16, and the dielectric element 16' are each formed with the width w3 described with respect to FIG. 1A. The width w3 may be equal to or less than about 40 nm. For example, the width w3 may be between about 10 nm and about 40 nm.

Figure 4I:
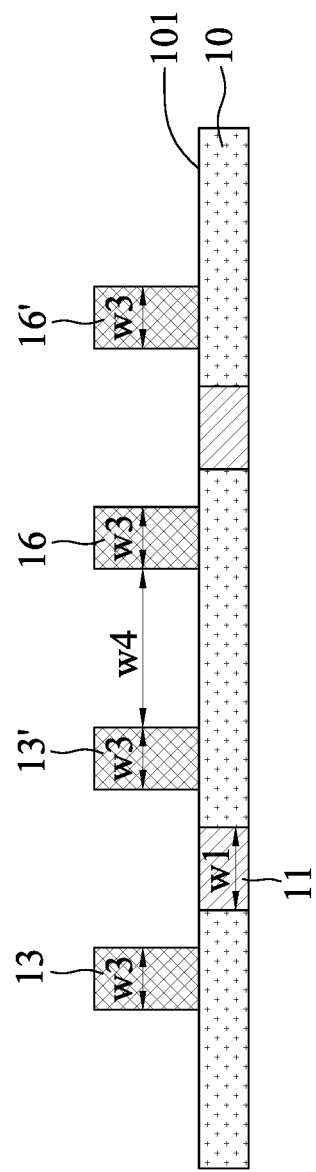
FIG. 4I illustrates one or more stages of a method of manufacturing a semiconductor device in accordance with some embodiments of the present disclosure.

Referring to FIG. 4I, the spacer 44*a*, the spacer 44*a*', the spacer 44*b*, and the spacer 44*b*' may be removed by, for example, an etching process.

Figure 4J:
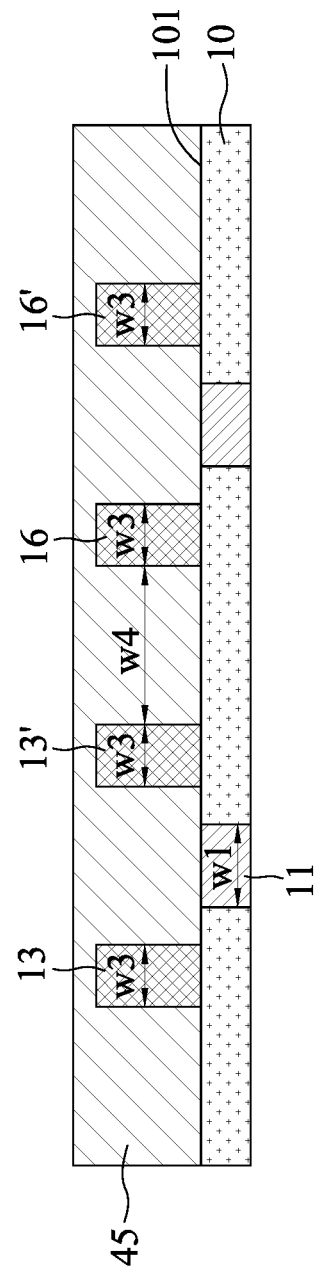
FIG. 4J illustrates one or more stages of a method of manufacturing a semiconductor device in accordance with some embodiments of the present disclosure.

Referring to FIG. 4J, a conductive layer 45 may be disposed on the substrate 10 to cover the dielectric element 13, the dielectric element 13', the dielectric element 16, and the dielectric element 16'. The conductive layer 45 may include, for example, polysilicon (poly-Si), metals (such as aluminum (Al), magnesium (Mg), tungsten (W), lanthanum (La), etc.), or metal alloys. The conductive layer 45 may be formed through, for example, an ALD operation, a CVD operation, an LPCVD operation, a PECVD operation, other feasible operations, or a combination thereof.

Figure 4K:
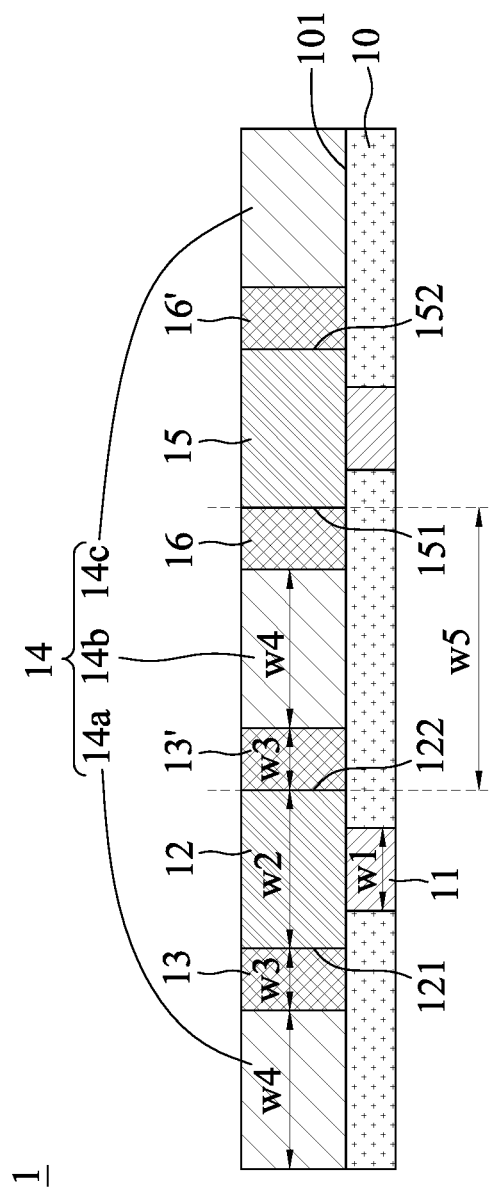
FIG. 4K illustrates one or more stages of a method of manufacturing a semiconductor device in accordance with some embodiments of the present disclosure.

Referring to FIG. 4K, the conductive layer 45 may be partially removed to form the shielding line 14*a*, the shielding line 14*b*, and shielding line 14*c*. In addition, the signal line 12 and signal line 15 may be formed in the same operation.

The width w4 may be defined by a pitch multiplication process, such as a self-aligned pitch doubling technique or a self-aligned double patterning technique. Since the minimum distance w5 between the signal line 12 and the signal line 15 is kept equal to or less than about 90 nm, the width w4 may be between about 10 nm and about 70 nm.

Figure 5:
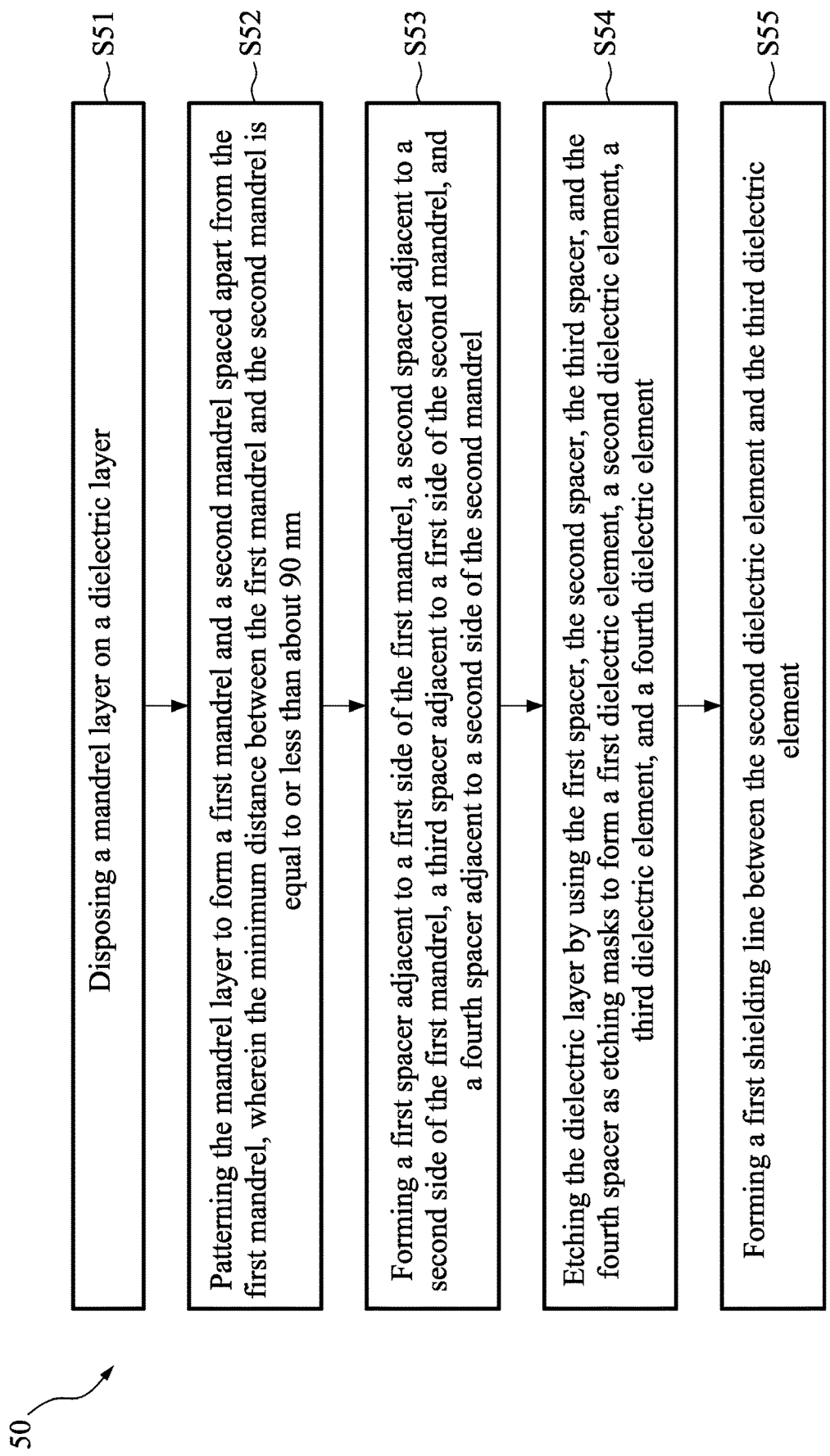
FIG. 5 illustrates a flow chart of a method of manufacturing a semiconductor device in accordance with some embodiments of the present disclosure.

FIG. 5 illustrates a flow chart of a method 50 of manufacturing a semiconductor device in accordance with some embodiments of the present disclosure.

In some embodiments, the method 50 may include a step S51, disposing a mandrel layer on a dielectric layer. For example, as shown in FIG. 4A, the mandrel layer 42 may be disposed on the dielectric layer 40.

In some embodiments, the method 50 may include a step S52, patterning the mandrel layer to form a first mandrel and a second mandrel spaced apart from the first mandrel. For example, as shown in FIG. 4C, the mandrel layer 42 may be patterned by etching using the mask pattern 43*p* as an etch mask. As a result, the mandrels 42*a* and 42*b* may be formed. In some embodiments, the minimum distance w5 between the mandrels 42*a* and 42*b* is equal to or less than about 90 nm.

In some embodiments, the method 50 may include a step S53, forming a first spacer adjacent to a first side of the first mandrel, a second spacer adjacent to a second side of the first mandrel, a third spacer adjacent to a first side of the second mandrel, and a fourth spacer adjacent to a second side of the second mandrel. For example, as shown in FIG. 4F, the conformal spacer layer 44 may be partially removed to form the spacer 44*a* adjacent to the side 421 of the mandrel 42*a*, the spacer 44*a*' adjacent to the side 422 of the mandrel 42*a*, the spacer 44*b* adjacent to the side 423 of the mandrel 42*b*, and the spacer 44*b*' adjacent to the side 424 of the mandrel 42*b*.

In some embodiments, the method 50 may include a step S54, etching the dielectric layer by using the first spacer, the second spacer, the third spacer, and the fourth spacer as etching masks to form a first dielectric element, a second dielectric element, a third dielectric element, and a fourth dielectric element. For example, as shown in FIG. 4H, the dielectric layer 40 may be patterned by etching using the spacer 44*a*, the spacer 44*a*', the spacer 44*b*, and the spacer 44*b*' as etch masks. As a result, the dielectric element 13, the dielectric element 13', the dielectric element 16, and the dielectric element 16' may be formed.

In some embodiments, the method 50 may include a step S55, forming a first shielding line between the second dielectric element and the third dielectric element. For example, as shown in FIG. 4K, the shielding line 14*b* is formed between the dielectric element 13' and the dielectric element 16.

One aspect of the present disclosure provides a semiconductor device. The semiconductor device includes a substrate having a surface, a first signal line disposed on the surface of the substrate, and a second signal line disposed on the surface of the substrate and spaced apart from the first signal line. The semiconductor device also includes a first shielding line between the first signal line and the second signal line. The minimum distance between the first signal line and the second signal line is equal to or less than about 90 nanometers (nm).

Another aspect of the present disclosure provides a semiconductor device. The semiconductor device includes a substrate having a surface, a first signal line disposed on the surface of the substrate, and a second signal line disposed on the surface of the substrate and spaced apart from the first signal line. The semiconductor device also includes a first shielding line between the first signal line and the second signal line. The minimum distance between the first signal line and the first shielding line is equal to or less than about 40 nm.

Another aspect of the present disclosure provides a method of manufacturing a semiconductor device. The method includes disposing a mandrel layer on a dielectric layer and patterning the mandrel layer to form a first mandrel and a second mandrel spaced apart from the first mandrel. The minimum distance between the first mandrel and the second mandrel is equal to or less than about 90 nm. The method also includes forming a first spacer adjacent to a first side of the first mandrel, a second spacer adjacent to a second side of the first mandrel, a third spacer adjacent to a first side of the second mandrel, and a fourth spacer adjacent to a second side of the second mandrel. The method also includes etching the dielectric layer by using the first spacer, the second spacer, the third spacer, and the fourth spacer as etching masks to form a first dielectric element, a second dielectric element, a third dielectric element, and a fourth dielectric element. The method also includes forming a first shielding line between the second dielectric element and the third dielectric element.

By forming a dummy line between two signal lines (such as an aggressor line and a victim line) and connecting the dummy line to power or ground, electromagnetic noise or crosstalk between the signal lines may be reduced or prevented.

In addition, the dummy line and the signal lines can be formed by a pitch multiplication process, such as a self-aligned pitch doubling technique or a self-aligned double patterning technique. In comparison with conventional lithographic techniques, the manufacturing process of the present disclosure overcomes lithography issues related to scaling, and creates a denser memory array. Therefore, the device performance can be enhanced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
   a substrate having a surface;
   first and second conductive elements disposed in the substrate, wherein a top surface of each of the first and second conductive element is exposed from the surface of the substrate;
   a first signal line disposed on the surface of the substrate and on the top surface of the first conductive element, wherein the first signal line is electrically connected with the first conductive element, wherein a width of the first signal line is greater than a width of the first conductive element, such that the first signal line is in direct contact with the surface of the substrate and the top surface of the first conductive element;
   a second signal line disposed on the surface of the substrate, on the top surface of the second conductive element, and spaced apart from the first signal line, wherein the second signal line is electrically connected with the second conductive element, wherein a width of the second signal line is greater than a width of the second conductive element, such that the second signal line is in direct contact with the surface of the substrate and the top surface of the second conductive element; and a first shielding line between the first signal line and the second signal line, wherein the first shielding line is not interconnect with any one of the first and second conductive elements;

wherein the minimum distance between the first signal line and the second signal line is equal to or less than 90 nanometers (nm).

2. The semiconductor device of claim 1, wherein the first signal line, the second signal line, and the first shielding line are substantially parallel, wherein heights of the first signal line, the second signal line, and the first shielding line are equal.

3. The semiconductor device of claim 1, wherein the minimum width of the first shielding line is between 10 nm and 70 nm, wherein the first shielding line serves as a dummy line.

4. The semiconductor device of claim 3, wherein the minimum width of the first shielding line is defined by a self-aligned pitch doubling technique.

5. The semiconductor device of claim 1, wherein the minimum distance between the first signal line and the first shielding line is between 10 nm and about 40 nm.

6. The semiconductor device of claim 5, wherein the minimum distance between the first signal line and the first shielding line is less than the minimum width of the first shielding line.

7. The semiconductor device of claim 5, wherein the minimum distance between the first signal line and the first shielding line is greater than the minimum width of the first shielding line.

8. The semiconductor device of claim 5, wherein the minimum distance between the first signal line and the first shielding line is substantially equal to the minimum width of the first shielding line.

9. The semiconductor device of claim 1, further comprising:
a second shielding line in direct contact with the surface of the substrate, wherein the first signal line is disposed between the first shielding line and the second shielding line, wherein the first shielding line is electrically connected with the second shielding line, wherein the second shielding line is not interconnect with any one of the first and second conductive elements.

10. The semiconductor device of claim 9, further comprising:
a third shielding line in direct contact with the surface of the substrate, wherein the second signal line is disposed between the first shielding line and the third shielding line, wherein the first shielding line is electrically connected with the third shielding line, wherein the third shielding line is not interconnect with any one of the first and second conductive elements.

11. The semiconductor device of claim 10, wherein the first shielding line, the second shielding line, and the third shielding line are substantially parallel, wherein the first, second and third shielding lines are arranged to provide an electromagnetic interference (EMI) shielding protection for the first and second signal lines.

12. The semiconductor device of claim 1, further comprising:

a first dielectric element contacting and sealing a first side of the first signal line; and
a second dielectric element contacting and sealing a second side of the first signal line opposite to the first side, wherein the second dielectric element is positioned between the first signal line and the first shielding line.

13. The semiconductor device of claim 12, wherein the minimum width of the first dielectric element is substantially equal to the minimum width of the second dielectric element, wherein a distance between the first signal line and the first shielding line is equal to the minimum width of the second dielectric element.

14. The semiconductor device of claim 12, wherein the first side and the second side of the first signal line are substantially perpendicular to the surface of the substrate, wherein the first and second dielectric elements are not interconnect with any one of the first and second conductive elements.

15. A semiconductor device, comprising:
a substrate having a surface;
first and second conductive elements disposed in the substrate, wherein a top surface of each of the first and second conductive element is exposed from the surface of the substrate;
a first signal line disposed on the surface of the substrate to electrically connect with the first conductive element, wherein the top surface of the first conductive element is entirely covered by the first signal line;
a second signal line disposed on the surface of the substrate to electrically connect with the second conductive element and spaced apart from the first signal line, wherein the top surface of the second conductive element is entirely covered by the second signal line; and
a first shielding line between the first signal line and the second signal line, wherein the first shielding line is not interconnect with the first and second conductive elements;
wherein the minimum distance between the first signal line and the first shielding line is equal to or less than 40 nm.

16. The semiconductor device of claim 15, wherein the first signal line, the second signal line, and the first shielding line are substantially parallel.

17. The semiconductor device of claim 15, wherein the minimum width of the first shielding line is between 10 nm and 70 nm.

18. The semiconductor device of claim 17, wherein the minimum distance between the first signal line and the first shielding line is less than the minimum width of the first shielding line.

19. The semiconductor device of claim 17, wherein the minimum distance between the first signal line and the first shielding line is greater than the minimum width of the first shielding line.

20. The semiconductor device of claim 17, wherein the minimum distance between the first signal line and the first shielding line is substantially equal to the minimum width of the first shielding line.

* * * * *